(12) United States Patent
Noh

(10) Patent No.: US 12,260,892 B2
(45) Date of Patent: Mar. 25, 2025

(54) INTEGRATED CIRCUIT AND MEMORY DEVICE INCLUDING SAMPLING CIRCUIT

(71) Applicant: SK hynix Inc., Gyeonggi-do (KR)

(72) Inventor: Jun Seok Noh, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 300 days.

(21) Appl. No.: 18/080,293

(22) Filed: Dec. 13, 2022

(65) Prior Publication Data
US 2024/0079041 A1 Mar. 7, 2024

(30) Foreign Application Priority Data
Sep. 2, 2022 (KR) .......................... 10-2022-0111396

(51) Int. Cl.
*G11C 11/00* (2006.01)
*G11C 11/406* (2006.01)

(52) U.S. Cl.
CPC ................................ *G11C 11/406* (2013.01)

(58) Field of Classification Search
CPC ......... G11C 11/40615; G11C 11/40611; G11C 11/408; G11C 11/40618; G11C 11/4076; G11C 11/406; G11C 7/20; G11C 7/22; G11C 2211/4065; G11C 7/109; G11C 7/1093; G11C 11/40622; G11C 11/4082; G11C 2211/4061; G11C 11/403; G11C 11/40603; G11C 11/4063; G11C 11/4072; G11C 11/4078; G11C 11/4085; G11C 11/4087; G11C 2207/2227; G11C 29/42; G11C 29/4401; G11C 29/52; G11C 7/222; G11C 7/225; G11C 11/40607; G11C 11/4091; G11C 7/02; G11C 7/106; G11C 7/1087; G11C 8/04; G11C 8/06; G11C 8/08

See application file for complete search history.

(56) References Cited

U.S. PATENT DOCUMENTS 10,229,728 B2   3/2019   Morgan et al.
11,094,369 B1*  8/2021   Joo ........................ G11C 7/106

FOREIGN PATENT DOCUMENTS

KR   10-2018-0114712 A   10/2018

* cited by examiner

*Primary Examiner* — Thong Q Le
(74) *Attorney, Agent, or Firm* — IP & T GROUP LLP

(57) ABSTRACT

An integrated circuit includes a sampling control circuit configured to: generate a counting signal according to a periodic signal during a sampling period, and generate a plurality of sampling enable signals by comparing counting bits of the counting signal with random bits of a random signal; and a sampling circuit configured to: store an input address as a plurality of sampling addresses according to the respective sampling enable signals, and generate a plurality of valid section signals based on the sampling enable signals to output one of the sampling addresses as a target address according to an uppermost valid section signal among activated valid section signals.

24 Claims, 12 Drawing Sheets

INTEGRATED CIRCUIT AND MEMORY DEVICE INCLUDING SAMPLING CIRCUIT

CROSS-REFERENCE TO RELATED APPLICATION

The present application claims the benefit of Korean Patent Application No. 10-2022-0111396, filed on Sep. 2, 2022, which is incorporated herein by reference in its entirety.

BACKGROUND

1. Field

Various embodiments of the present invention relate to a semiconductor design technology, and more particularly, to an integrated circuit and a memory device including a sampling circuit that randomly samples input signals.

2. Description of the Related Art

Recently, in addition to a normal refresh operation, an additional refresh operation which will be, hereinafter, referred to as a 'target refresh operation', is being performed on the memory cells of a specific word line that is likely to lose data due to row hammering. The row hammering phenomenon refers to a phenomenon in which data of memory cells coupled to a specific word line or adjacent word lines disposed adjacent to the specific word line are damaged due to a high number of activations of the specific word line. In order to prevent the row hammering phenomenon, a target refresh operation is performed on a word line that is activated more than a predetermined number of times, and adjacent word lines disposed adjacent to the word line.

In the target refresh operation, word lines on which the target refresh operation is to be performed may be selected by randomly sampling addresses based on probability. Accordingly, research on a sampling circuit for randomly sampling addresses has been conducted.

SUMMARY

Embodiments of the present invention are directed to an integrated circuit and a memory device including a sampling circuit capable of randomly sampling addresses according to a sampling enable signal.

According to an embodiment of the present invention, an integrated circuit includes a sampling control circuit configured to: generate a counting signal according to a periodic signal during a sampling period, and generate a plurality of sampling enable signals by comparing counting bits of the counting signal with random bits of a random signal; and a sampling circuit configured to: store an input address as a plurality of sampling addresses according to the respective sampling enable signals, and generate a plurality of valid section signals based on the sampling enable signals to output one of the sampling addresses as a target address according to an uppermost valid section signal among activated valid section signals.

According to an embodiment of the present invention, a memory device includes a sampling control circuit configured to: generate a counting signal according to a target refresh command, and generate a plurality of sampling enable signals by comparing counting bits of the counting signal with random bits of a random signal; an address storing circuit configured to store an input address as a plurality of sampling addresses according to the respective sampling enable signals; an address output circuit configured to output one of the sampling addresses as a target address according to an uppermost valid section signal among activated ones of a plurality of valid section signals which are generated based on the respective sampling enable signals, when the target refresh command is inputted; and a row control circuit configured to refresh at least one word line corresponding to the target address in response to the target refresh command.

According to an embodiment of the present invention, a sampling method of an integrated circuit includes setting a random signal and generating a plurality of sampling enable signals, when a sampling period starts; generating a counting signal by counting a toggling number of a periodic signal; sequentially deactivating the sampling enable signals by comparing counting bits of the counting signal with random bits of the random signal; storing an input address as a plurality of sampling addresses and sequentially activating a plurality of valid section signals, according to the deactivating of the sampling enable signals; and outputting one of the sampling addresses as a target address according to an uppermost valid section signal among the activated valid section signals, when the sampling period ends.

According to an embodiment of the present invention, a memory device includes a refresh circuit configured to refresh a memory cell group corresponding to a target address; a control circuit configured to generate N number of control signals each becoming disabled when a corresponding one of N number of pairs has an identical value, each of the pairs being of one or more bits from a N-bit count code and one or more bits from a N-bit random code and the pairs respectively having bitwise different ranges between one (1) bit and N bits; and a sampling circuit configured to: generate, based on an active address, N number of sample addresses when the control signals become disabled, respectively, generate N number of section signals enabled when the control signals become disabled, respectively, and select, as the target address, one of the sample addresses, the selected sample address corresponding to a last enabled one of the section signals.

According to the embodiments of the present invention, the integrated circuit may maximize randomization and prevent index failure by generating a plurality of sampling enable signals by varying and comparing the number of bits of the random signal and the counting signal that is generated by counting the periodic signal, and performing a sampling operation according to the sampling enable signals. In addition, according to the embodiments of the present invention, the integrated circuit may maximize accuracy of address sampling and improve efficiency of a target refresh operation by applying a sampling circuit to a memory device performing the target refresh operation by sampling addresses based on probability.

DETAILED DESCRIPTION

Figure 1:
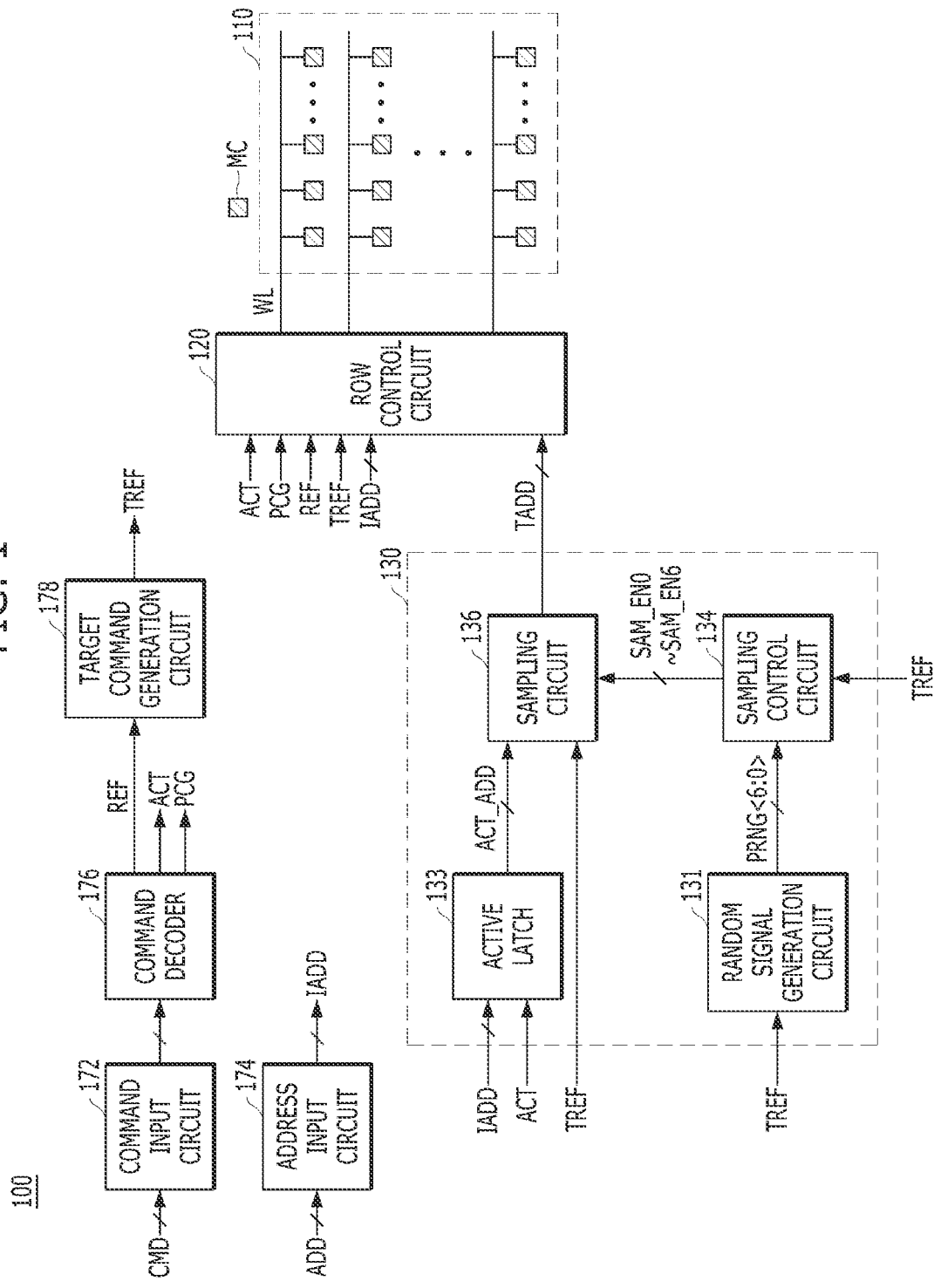
FIG. 1 is a block diagram illustrating a memory device in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout this disclosure, like reference numerals refer to like parts throughout the various figures and embodiments of the present invention.

It will be understood that when an element is referred to as being "coupled" or "connected" to another element, it may mean that the two are directly coupled or the two are electrically connected to each other with another circuit intervening therebetween. It will be further understood that the terms "comprise", "include", "have", etc. when used in this specification, specify the presence of stated features, numbers, steps, operations, elements, components, and/or combinations of them but do not preclude the presence or addition of one or more other features, numbers, steps, operations, elements, components, and/or combinations thereof. In the present disclosure, the singular forms are intended to include the plural forms as well, unless the context clearly indicates otherwise.

Hereinafter, a memory device will be described as an example of an integrated circuit including a sampling circuit. However, the present invention is not limited thereto, and may be applied to all integrated circuits including a sampling circuit for randomly sampling input addresses or signals. In addition, in the following embodiments, a description of a configuration related to a data input/output operation will be omitted to focus on a refresh operation.

FIG. 1 is a block diagram illustrating a memory device 100 in accordance with an embodiment of the present invention.

Referring to FIG. 1, the memory device 100 may include a memory cell array 110, a row control circuit 120, a refresh control circuit 130, a command input circuit 172, an address input circuit 174, a command decoder 176, and a target command generation circuit 178.

The memory cell array 110 may include a plurality of memory cells MC coupled to a plurality of word lines WL and a plurality of bit lines. The memory cell array 110 may include a plurality of banks.

The number of banks or the number of memory cells MC may be determined depending on the capacity of the memory device 100.

The command input circuit 172 may receive a command CMD, and the address input circuit 174 may receive an address ADD, from an external device, e.g., a memory controller. The address input circuit 174 may receive the address ADD and output an internal input address IADD. Each of the command CMD and the address ADD may include a multi-bit signal. The command decoder 176 may decode the command CMD input through the command input circuit 172 and may generate an active command ACT, a precharge command PCG, and a normal refresh command REF. The command decoder 176 may generate a read command and a write command, as well as other commands, by decoding received commands CMD.

The target command generation circuit 178 may generate a target refresh command TREF based on the normal refresh command REF. For example, the target command generation circuit 178 may generate the target refresh command TREF whenever the number of inputs of the normal refresh command REF reaches a preset number.

The row control circuit 120 may activate a word line corresponding to the internal input address IADD in response to the active command ACT, and may precharge the activated word line in response to the precharge command PCG. In order to select a word line to be refreshed during a normal refresh operation, a refresh counter (not shown) for generating a counting address that is sequentially increasing according to the normal refresh command REF may be additionally provided. The row control circuit 120 may perform the normal refresh operation of sequentially refreshing a plurality of word lines WL corresponding to the counting address according to the normal refresh command REF. The row control circuit 120 may perform a target refresh operation of refreshing one or more neighboring word lines of a word line WL corresponding to a target address TADD according to the target refresh command TREF.

The refresh control circuit 130 may generate a random signal PRNG<6:0> that is changed to a random value according to the target refresh command TREF and generate a plurality of sampling enable signals SAM_EN0 to SAM_EN6 based on the random signal PRNG<6:0>. The refresh control circuit 130 may latch the internal input address IADD as an active address ACT_ADD according to the active command ACT. The refresh control circuit 130 may sample the active address ACT_ADD as a plurality of sampling addresses according to the sampling enable signals SAM_EN0 to SAM_EN6, and output one of the sampled addresses as a target address TADD according to the target refresh command TREF.

In detail, the refresh control circuit 130 may include a random signal generation circuit 131, an active latch 133, a sampling control circuit 134, and a sampling circuit 136.

The random signal generation circuit 131 may generate the random signal PRNG<6:0> according to the target refresh command TREF. The random signal generation circuit 131 may change a value of the random signal PRNG<6:0> when the target refresh command TREF is inputted. Preferably, the random signal generation circuit 131 may be implemented with a pseudo-random number generator (PRNG) based on a linear feedback shift register (LFSR), or a pseudo-random binary sequence (PRBS) random pattern generator based on LFSR. Hereinafter, a case in which the random signal PRNG<6:0> is formed of random bits of 7 bits will be described as an example. A detailed configuration and operation of the random signal generation circuit 131 will be described with reference to FIG. 2.

The active latch 133 may latch the internal input address IADD as the active address ACT_ADD according to the active command ACT.

The sampling control circuit 134 may generate a counting signal (OSC_CNT<6:0> of FIG. 3) by counting the number of toggles (hereinafter, toggling number) of a periodic signal (OSC of FIG. 3) during a sampling period. The sampling control circuit 134 may generate the plurality of sampling enable signals (e.g., first to seventh sampling enable signals SAM_EN0 to SAM_EN6) by comparing counting bits of the counting signal OSC_CNT<6:0> with random bits of the random signal PRNG<6:0>. In particular, the sampling control circuit 134 may generate the first to seventh sampling enable signals SAM_EN0 to SAM_EN6 by comparing one or more random bits of the random signal PRNG<6:0> with one or more counting bits of the counting signal OSC_CNT<6:0>, while comparing different numbers of the random bits with the counting bits during the sampling period. That is, numbers to be compared between the random bits and the counting bits may be different for the respective sampling enable signals SAM_EN0 to SAM_EN6. For example, the sampling control circuit 134 may generate the first sampling enable signal SAM_EN0 by comparing a first random bit PRNG<0> with a first counting bit OSC_CNT<0>, and generate the second sampling enable signal SAM_EN1 by comparing the first random bit PRNG<0> with the first counting bit OSC_CNT<0>, and comparing the second random bit PRNG<1> with the second counting bit OSC_CNT<1>. In this way, the sampling control circuit 134 may generate the seventh sampling enable signal SAM_EN6 by respectively comparing the first to seventh random bits PRNG<6:0> with the first to seventh counting bits OSC_CNT<6:0>. A detailed configuration and operation of the sampling control circuit 134 will be described with reference to FIGS. 3 to 6.

For reference, the sampling period may be determined by the target refresh command TREF, and one sampling period may be defined as a target refresh period between adjacent two target refresh commands TREF. According to an embodiment, in the case of an integrated circuit, the target refresh command TREF may be defined as a sampling signal.

The sampling circuit 136 may sample and store the active address ACT_ADD as first to seventh sampling addresses (SAM_ADD0 to SAM_ADD6 of FIG. 7) according to the first to seventh sampling enable signals SAM_EN0 to SAM_EN6. The sampling circuit 136 may generate first to seventh valid section signals (F_VALID0 to F_VALID6 of FIG. 7) based on the target refresh command TREF and the first to seventh sampling enable signals SAM_EN0 to SAM_EN6, and output one of the first to seventh sampling addresses SAM_ADD0 to SAM_ADD6 as the target address TADD according to an uppermost valid section signal among activated valid section signals of the first to seventh valid section signals F_VALID0 to F_VALID6. According to an embodiment, the sampling circuit 136 may calculate one or more adjacent addresses using the stored address and output the calculated adjacent addresses as the target address TADD. A detailed configuration and operation of the sampling circuit 136 will be described with reference to FIGS. 7 to 12.

As described above, in an embodiment of the present invention, the memory device 100 may generate the sampling enable signals SAM_EN0 to SAM_EN6 by comparing one or more random bits of the random signal PRNG<6:0> with one or more counting bits of the counting signal OSC_CNT<6:0>, numbers to be compared between the random bits and the counting bits being different for the respective sampling enable signals SAM_EN0 to SAM_EN6. The memory device 100 may mitigate the periodicity of the sampling circuit and maximize the randomization by performing the sampling operation according to the sampling enable signals SAM_EN0 to SAM_EN6.

In addition, in an embodiment of the present invention, the memory device 100 may sample the active address according to the sampling enable signals SAM_EN0 to SAM_EN6, as the sampling addresses, and output one of the sampling addresses as the target address TADD. That is, even if the counting signal OSC_CNT<6:0> does not reach the random signal PRNG<6:0>, the memory device 100 may output the target address TADD by selecting one of the sampling addresses, thereby maximizing the randomization and preventing the index failure.

Hereinafter, a detailed configuration of the components of FIG. 1 will be described with reference to the drawings.

Figure 2:
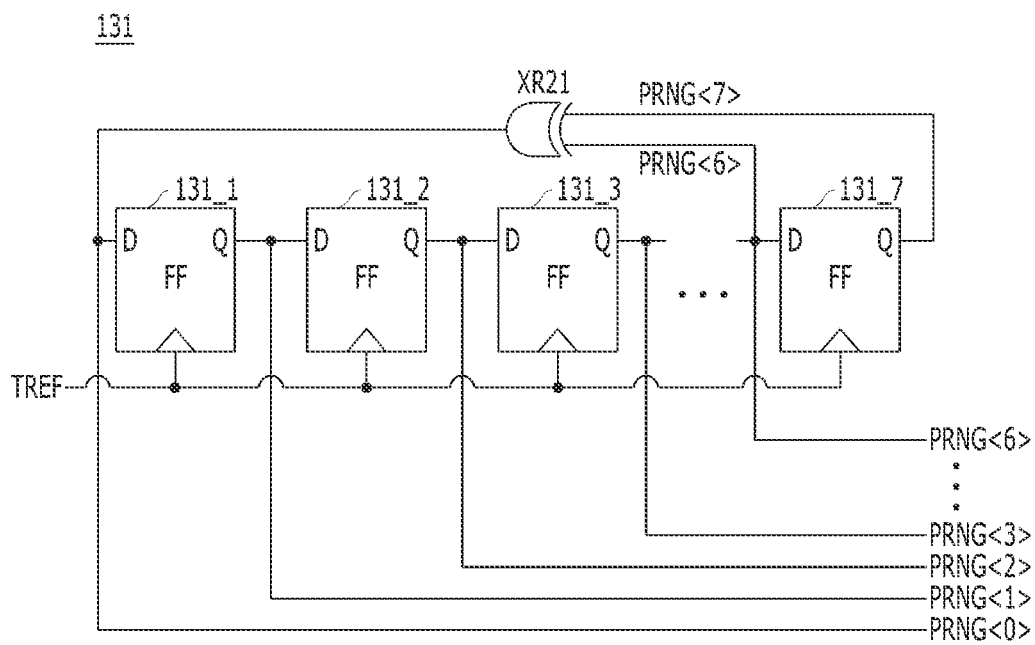
FIG. 2 is a circuit diagram illustrating a random signal generation circuit shown in FIG. 1 in accordance with an embodiment of the present invention.

FIG. 2 is a circuit diagram illustrating the random signal generation circuit 131 shown in FIG. 1 in accordance with an embodiment of the present invention.

Referring to FIG. 2, the random signal generation circuit 131 may be implemented with a linear feedback shift register (LFSR). For example, the random signal generation circuit 131 may include a plurality of flip-flops 131_1 to 131_7 coupled in series and an XOR gate XR21. For example, to generate the random signal PRNG<6:0> composed of random bits of 7 bits, first to seventh flip-flops 131_1 to 131_7 may be coupled in series. The first to seventh flip-flops 131_1 to 131_7 may receive the target refresh command TREF as a clock signal to transmit a signal of an input terminal (D) to an output terminal (Q). The signals at the input terminals (D) of the first to seventh flip-flops 131_1 to 131_7 may be outputted as the first to seventh random bits of the random signal PRNG<6:0>, respectively. A signal from the output terminal (Q) of any (e.g., the sixth flip-flop 131_6) of the first to sixth flip-flops 131_1 to 131_6, and a signal from the output terminal (Q) of the seventh flip-flop 131_7 may be provided to inputs of the XOR gate XR21. For example, the seventh random bit PRNG<6> and an eighth random bit PRNG<7> may be provided to the inputs of the XOR gate XR21. An output of the XOR gate XR21 may be provided to the input terminal (D) of the first flip-flop 131_1.

With the above configuration, the random signal generation circuit 131 may change and output the value of the random signal PRNG<6:0> each time the target refresh command TREF is inputted.

Figure 3:
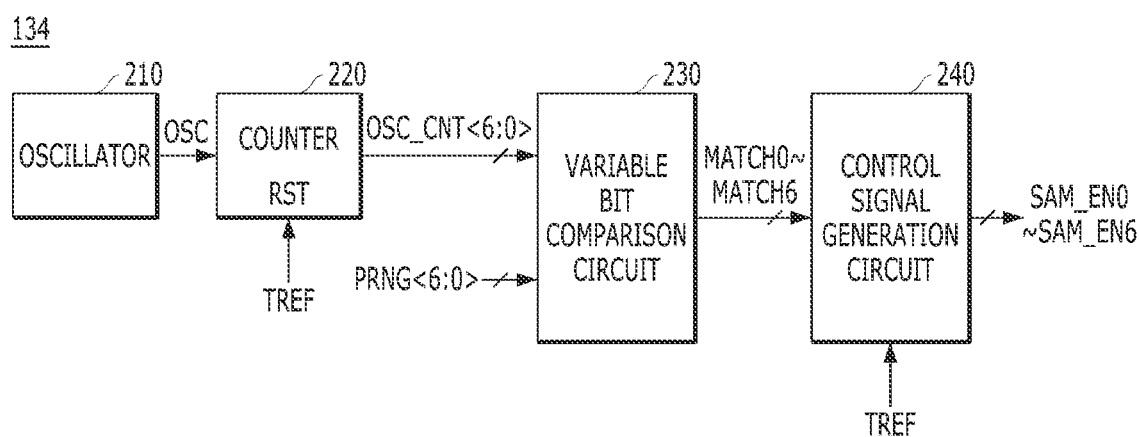
FIG. 3 is a detailed configuration diagram illustrating a sampling control circuit shown in FIG. 1 in accordance with an embodiment of the present invention.

FIG. 3 is a detailed configuration diagram illustrating the sampling control circuit 134 shown in FIG. 1 in accordance with an embodiment of the present invention.

Referring to FIG. 3, the sampling control circuit 134 may include an oscillator 210, a counter 220, a variable bit comparison circuit 230, and a control signal generation circuit 240.

The oscillator 210 may generate the periodic signal OSC that toggles at a predetermined period. For example, the oscillator 210 may receive an internal clock signal and generate the periodic signal OSC.

The counter 220 may generate the counting signal OSC_CNT<6:0> by counting the toggling number of the periodic signal OSC during the sampling period. The counter 220 may be reset in response to the target refresh command TREF, and generate the counting signal OSC_CNT<6:0> that has a value increasing by "+1" when the periodic signal OSC toggles. Preferably, the counter 220 may increase the value of the counting signal OSC_CNT<6:0> by "+1" in response to a falling edge of the periodic signal OSC. For example, to generate the counting signal OSC_CNT<6:0> consisting of the counting bits of 7 bits, first to seventh unit counters may be coupled in series. The target refresh command TREF may be provided to a reset terminal of each of the first to seventh unit counters, the periodic signal OSC may be provided to an input terminal of the first unit counter, and the counting bits of the counting signal OSC_CNT<6:0> may be outputted from output terminals of the first to seventh unit counters, respectively.

The variable bit comparison circuit 230 may generate first to seventh match signals MATCH0 to MATCH6 by varying numbers of the random bits of the random signal PRNG<6:0> and the counting bits of the counting signal OSC_CNT<6:0>, which are to be compared with each other for the respective match signals MATCH0 to MATCH6. For example, the variable bit comparison circuit 230 may sequentially increase the number of the compared random bits and the compared counting bits to output the comparison result as the first to seventh match signals MATCH0 to MATCH6.

The control signal generation circuit 240 may output the first to seventh sampling enable signals SAM_EN0 to SAM_EN6 of a logic high level in response to the target refresh command TREF, and output the first to seventh sampling enable signals SAM_EN0 to SAM_EN6 of a logic low level in response to the first to seventh match signals MATCH0 to MATCH6, respectively. For example, the control signal generation circuit 240 may respectively output the first to seventh sampling enable signals SAM_EN0 to SAM_EN6 of a logic low level in response to falling edges of the first to seventh match signals MATCH0 to MATCH6.

Figure 4:
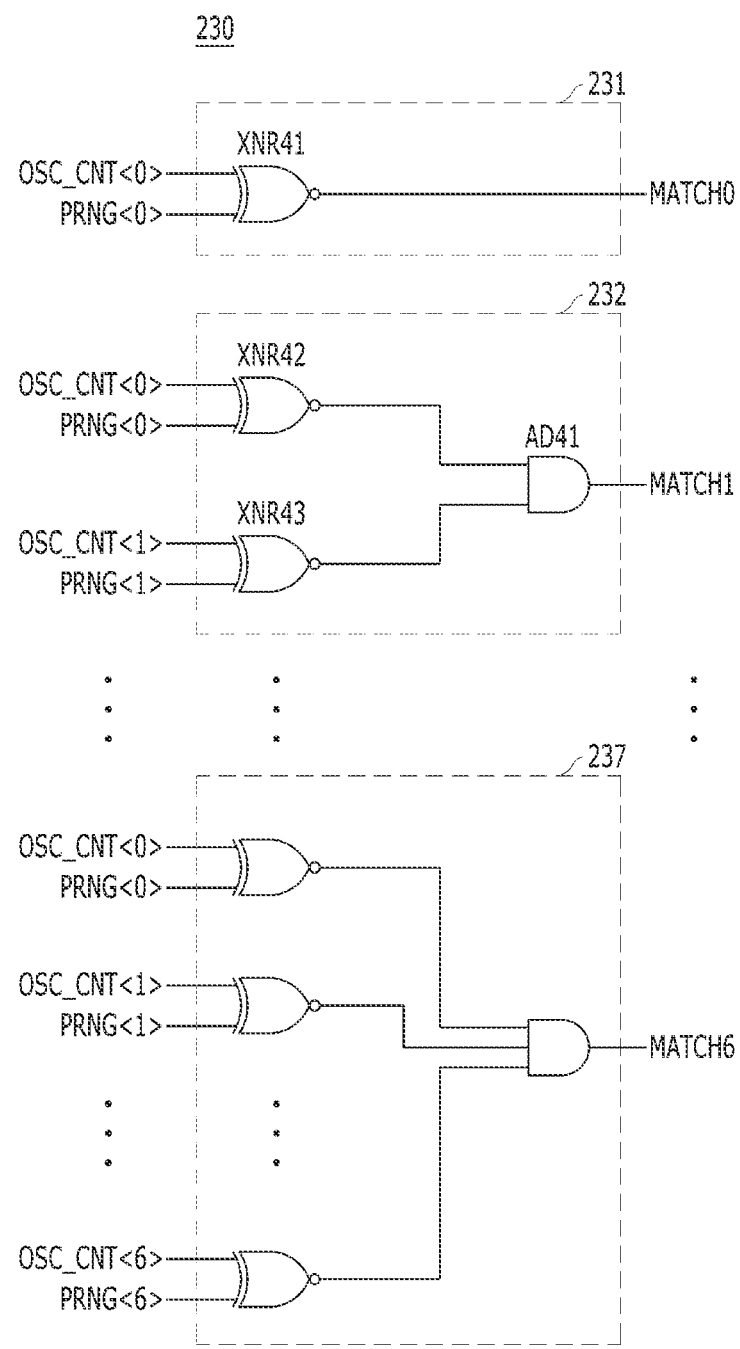
FIG. 4 is a circuit diagram illustrating a variable bit comparison circuit shown in FIG. 3 in accordance with an embodiment of the present invention.

FIG. 4 is a circuit diagram illustrating the variable bit comparison circuit 230 shown in FIG. 3 in accordance with an embodiment of the present invention.

Referring to FIG. 4, the variable bit comparison circuit 230 may include first to seventh comparators 231 o 237. Each of the first to seventh comparators 231 to 237 may generate a corresponding one of the first to seventh match signals MATCH0 to MATCH6 by comparing the numbers with each other between the random bits and the counting bits, each of the numbers corresponding to each comparator being more than a comparator at a previous stage.

In detail, the first comparator 231 may generate the first match signal MATCH0 by comparing the first random bit PRNG<0> and the first counting bit OSC_CNT<0>. For example, the first comparator 231 may include a first XNOR gate XNR41 for performing a logic exclusive NOR operation on the first random bit PRNG<0> and the first counting bit OSC_CNT<0>. With the above configuration, the first comparator 231 may activate the first match signal MATCH0 to a logic high level when the first random bit PRNG<0> has a logic level identical to that of the first counting bit OSC_CNT<0>.

The second comparator 232 may generate the second match signal MATCH1 by comparing the first random bit PRNG<0> and the first counting bit OSC_CNT<0>, and the second random bit PRNG<1> and the second counting bit OSC_CNT<1>. For example, the second comparator 232 may include second and third XNOR gates XNR42 and XNR43, and a first AND gate AD41. The second XNOR gate XNR42 may perform a logic exclusive NOR operation on the first random bit PRNG<0> and the first counting bit OSC_CNT<0>, and the third XNOR gate XNR43 may perform a logic exclusive NOR operation on the second random bit PRNG<1> and the second counting bit OSC_CNT<1>. The first AND gate AD41 may perform a logic AND operation on outputs of the second and third XNOR gates XNR42 and XNR43. With the above configuration, the second comparator 232 may activate the second match signal MATCH1 to a logic high level when the first and second random bits PRNG<1:0> have logic levels identical to those of the first and second counting bits OSC_CNT<1:0>.

In this way, the seventh comparator 237 may generate the seventh match signal MATCH6 by comparing the first to seventh random bits PRNG<6:0> and the first to seventh counting bits OSC_CNT<6:0>, respectively. The seventh comparator 237 may activate the seventh match signal MATCH6 to a logic high level when the first to seventh random bits PRNG<6:0> have logic levels identical to those of the first to seventh counting bits OSC_CNT<6:0>.

Figure 5:
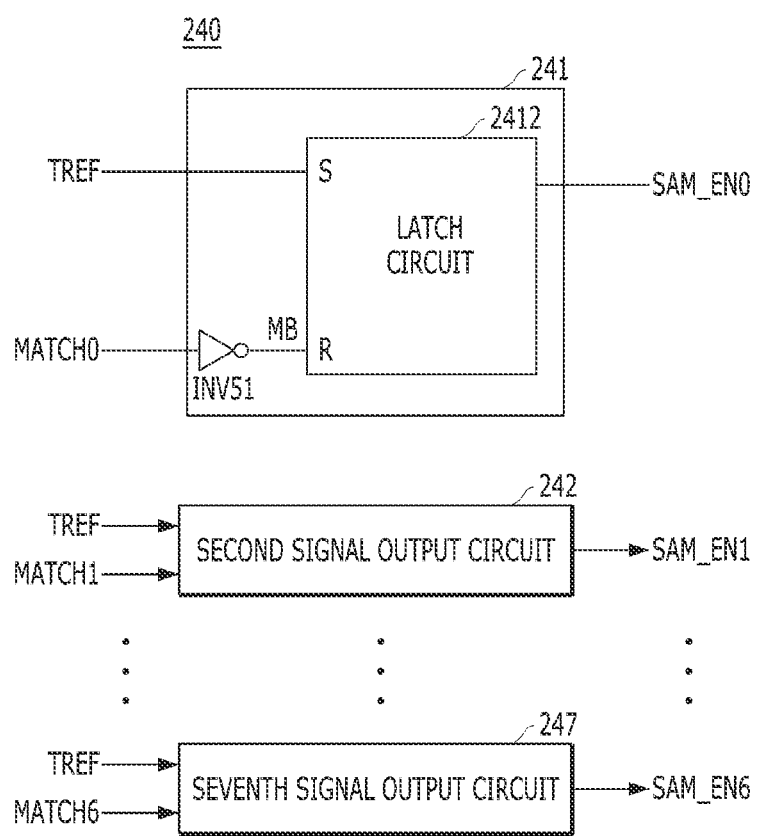
FIG. 5 is a circuit diagram illustrating a control signal generation circuit shown in FIG. 3 in accordance with an embodiment of the present invention.

FIG. 5 is a circuit diagram illustrating the control signal generation circuit 240 shown in FIG. 3 in accordance with an embodiment of the present invention.

Referring to FIG. 5, the control signal generation circuit 240 may include first to seventh signal output circuits 241 o 247. Since the first to seventh signal output units 241 to 247 have the same configuration except for receiving the first to seventh match signals MATCH0 to MATCH6, the first signal output unit 241 will be described as an example.

The first signal output unit 241 may include an inverter INV51 and a latch circuit 2412. The inverter INV51 may output an inverted match signal MB by inverting the first match signal MATCH0. The latch circuit 2412 may receive the target refresh command TREF as a set signal and the inverted match signal MB as a reset signal, and output the first sampling enable signal SAM_EN0. The latch circuit 2412 may set the first sampling enable signal SAM_EN0 to a logic high level in response to the target refresh command TREF, and reset the first sampling enable signal SAM_EN0 to a logic low level in response to the inverted match signal MB (i.e., a falling edge of the first match signal MATCH0). The latch circuit 2412 may be implemented with a known SR latch, and may include, for example, cross-coupled NOR gates and an inverter.

Figure 6:
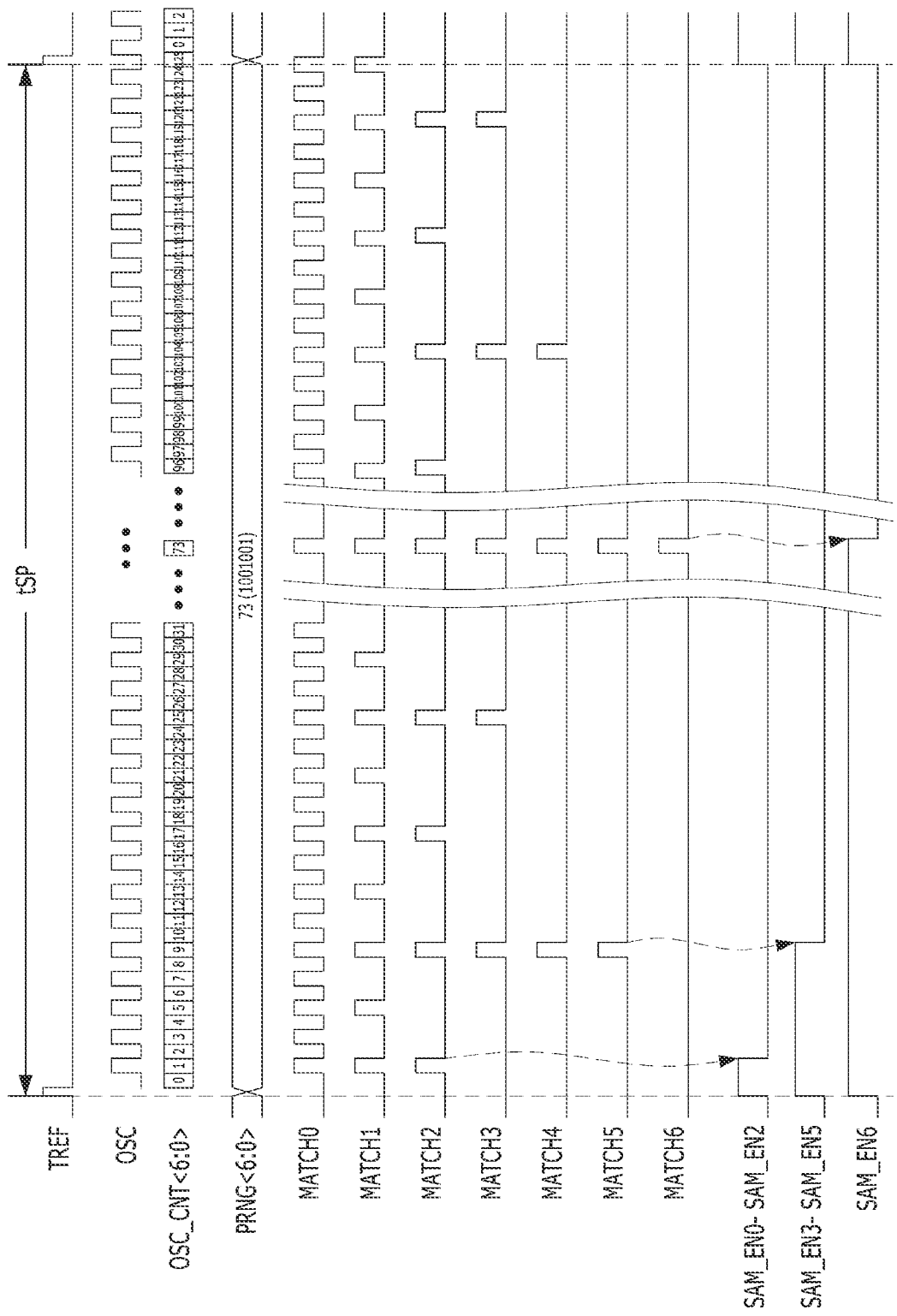
FIG. 6 is a waveform diagram for describing an operation of a sampling control circuit shown in FIG. 3 in accordance with an embodiment of the present invention.

FIG. 6 is a waveform diagram for describing an operation of the sampling control circuit 134 shown in FIG. 3 in accordance with an embodiment of the present invention.

Referring to FIG. 6, the oscillator 210 may generate the periodic signal OSC that toggles at a predetermined period. When the target refresh command TREF is inputted, the counter 220 may generate the counting signal OSC_CNT<6:0> sequentially increasing from "000 0000" by counting the toggling number of the periodic signal OSC. The sampling period tSP may be determined by the target refresh command TREF. The random signal generation circuit 131 may output the random signal PRNG<6:0> of "100 1001" (decimal 73) according to the target refresh command TREF. The control signal generation circuit 240 may set the first to seventh sampling enable signals SAM_EN0 to SAM_EN6 to a logic high level in response to the target refresh command TREF.

The variable bit comparison circuit 230 may generate the first to seventh match signals MATCH0 to MATCH6 by varying numbers of the random bits of the random signal PRNG<6:0> and the counting bits of the counting signal OSC_CNT<6:0>, which are to be compared with each other for the respective match signals MATCH0 to MATCH6.

In detail, since the first random bit PRNG<0> is a high bit of "1", the first comparator 231 may activate the first match signal MATCH0 to a logic high level whenever the first counting bit OSC_CNT<0> becomes a high bit of "1". Since the first and second random bits PRNG<1:0> are "01", the second comparator 232 may activate the second match signal MATCH1 to a logic high level whenever the first and second counting bits OSC_CNT<1:0> becomes "01". Since the first to third random bits PRNG<2:0> are "001", the third comparator 233 may activate the third match signal MATCH2 to a logic high level whenever the first to third counting bits OSC_CNT<2:0> becomes "001". Since the first to fourth random bits PRNG<3:0> are "1001", the fourth comparator 234 may activate the fourth match signal MATCH3 to a logic high level whenever the first to fourth counting bits OSC_CNT<3:0> becomes "1001". Since the first to fifth random bits PRNG<4:0> are "0 1001", the fifth comparator 235 may activate the fifth match signal MATCH4 to a logic high level whenever the first to fifth counting bits OSC_CNT<4:0> becomes "0 1001". Since the first to sixth random bits PRNG<5:0> are "00 1001", the sixth comparator 236 may activate the sixth match signal MATCH5 to a logic high level whenever the first to sixth counting bits OSC_CNT<5:0> becomes "00 1001". In this way, the seventh comparator 237 may activate the seventh match signal MATCH6 to a logic high level whenever the first to seventh counting bits OSC_CNT<6:0> becomes "100 1001".

The control signal generation circuit 240 may reset the first to seventh sampling enable signals SAM_EN0 to SAM_EN6 to a logic low level in response to the first to seventh match signals MATCH0 to MATCH6, respectively. The control signal generation circuit 240 may reset the first to third sampling enable signals SAM_EN0 to SAM_EN2 to a logic low level in response to first falling edges of the first to third match signals MATCH0 to MATCH2, respectively. The control signal generation circuit 240 may reset the fourth to sixth sampling enable signals SAM_EN3 to SAM_EN5 to a logic low level in response to first falling edges of the fourth to sixth match signals MATCH3 to MATCH5, respectively. The control signal generation circuit 240 may reset the seventh sampling enable signal SAM_EN6 to a logic low level in response to a first falling edge of the seventh match signal MATCH6.

Figure 7:
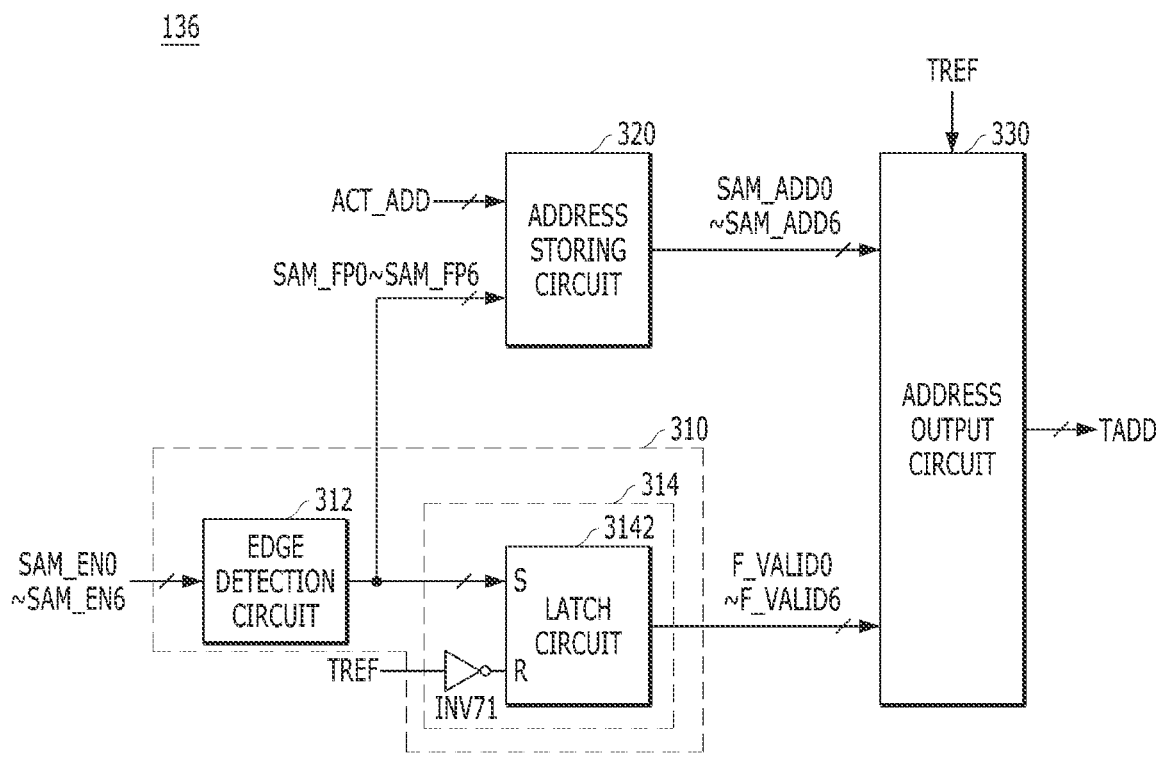
FIG. 7 is a detailed configuration diagram illustrating a sampling circuit shown in FIG. 1 in accordance with an embodiment of the present invention.

FIG. 7 is a detailed configuration diagram illustrating the sampling circuit 136 shown in FIG. 1 in accordance with an embodiment of the present invention.

Referring to FIG. 7, the sampling circuit 136 may include a section definition circuit 310, an address storing circuit 320, and an address output circuit 330.

The section definition circuit 310 may generate the first to seventh valid section signals F_VALID0 to F_VALID6 which are set to a logic high level according to the first to seventh sampling enable signals SAM_EN0 to SAM_EN6, respectively, and set to a logic low level according to the target refresh command TREF. In particular, the section definition circuit 310 may generate the first to seventh valid section signals F_VALID0 to F_VALID6 set to a logic high level in response to falling edges of the first to seventh sampling enable signals SAM_EN0 to SAM_EN6, respectively, and set to a logic low level in response to a falling edge of the target refresh command TREF.

In detail, the section definition circuit 310 may include an edge detection circuit 312 and a valid signal generation circuit 314.

The edge detection circuit 312 may generate first to seventh falling edge signals SAM_FP0 to SAM_FP6 by detecting the falling edges of the first to seventh sampling enable signals SAM_EN0 to SAM_EN6.

Figure 8A:
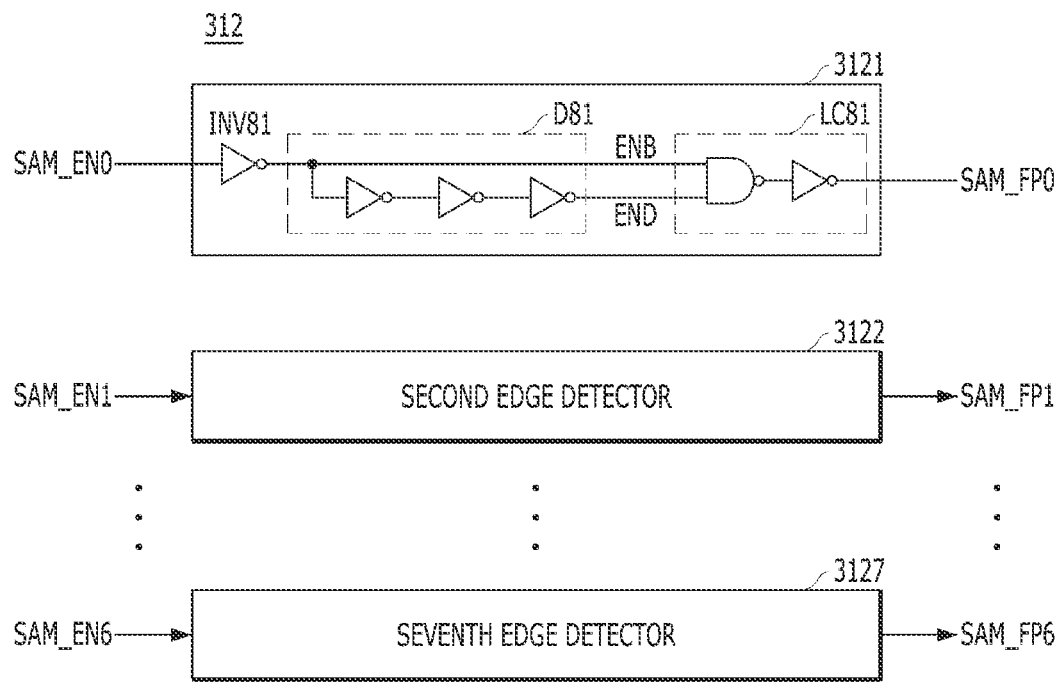
FIGS. 8A and 8B are a circuit diagram of an edge detection circuit shown in FIG. 7 and a waveform diagram for describing an operation thereof in accordance with an embodiment of the present invention.
Figure 8B:
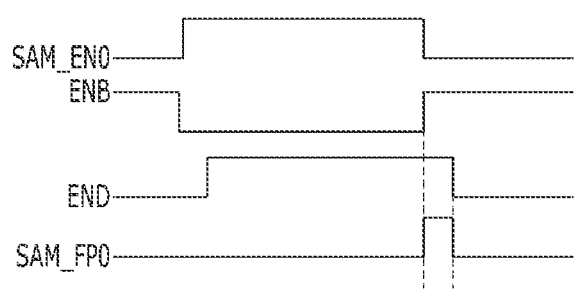

FIGS. 8A and 8B are a circuit diagram of the edge detection circuit 312 shown in FIG. 7 and a waveform diagram for describing an operation thereof, in accordance with an embodiment of the present invention.

Referring to FIG. 8A, the edge detection circuit 312 may include first to seventh edge detectors 3121 to 3127. The first to seventh edge detectors 3121 to 3127 have the same configuration except for receiving the first to seventh sampling enable signals SAM_EN0 to SAM_EN6, respectively, so the first edge detector 3121 will be described as an example.

The first edge detector 3121 may include an inverter INV81, a delay D81, and a logic combiner LC81. The inverter INV81 may generate an inverted enable signal ENB by inverting the first sampling enable signal SAM_EN0. The delay D81 may generate a delay signal END by inverting and delaying the inverted enable signal ENB. Preferably, the delay D81 may be implemented with an odd number of inverters. The logic combiner LC81 may output the first falling edge signal SAM_FP0 by performing a logic AND operation on the inverted enable signal ENB and the delay signal END.

Referring to FIG. 8B, the first edge detector 3121 may generate the first falling edge signal SAM_FP0 that pulses for a predetermined period when the first sampling enable signal SAM_EN0 is deactivated from a logic high level to a logic low level (i.e., at the falling edge of the first sampling enable signal SAM_EN0).

Referring back to FIG. 7, the valid signal generation circuit 314 may output the first to seventh valid section signals F_VALID0 to F_VALID6 of a logic high level according to the first to seventh falling edge signals SAM_FP0 to SAM_FP6, respectively. The valid signal generation circuit 314 may output the first to seventh valid section signals F_VALID0 to F_VALID6 of a logic low level according to the target refresh command TREF. In particular, the valid signal generation circuit 314 may output the first to seventh valid section signals F_VALID0 to F_VALID6 of a logic low level in response to a falling edge of the target refresh command TREF.

For example, the valid signal generation circuit 314 may include an inverter INV71 and a latch circuit 3142. The inverter INV71 may invert the target refresh command TREF. The latch circuit 3142 may include first to seventh unit latches which respectively receive the first to seventh falling edge signals SAM_FP0 to SAM_FP6 as a set signal, receive an output of the inverter INV71 as a reset signal, and respectively output the first to seventh valid section signals F_VALID0 to F_VALID6. The latch circuit 3142 may be implemented with a known SR latch, and may include, for example, cross-coupled NOR gates and an inverter.

The address storing circuit 320 may store the active address ACT_ADD as the first to seventh sampling addresses SAM_ADD0 to SAM_ADD6 according to the first to seventh falling edge signals SAM_FP0 to SAM_FP6.

Figure 9:
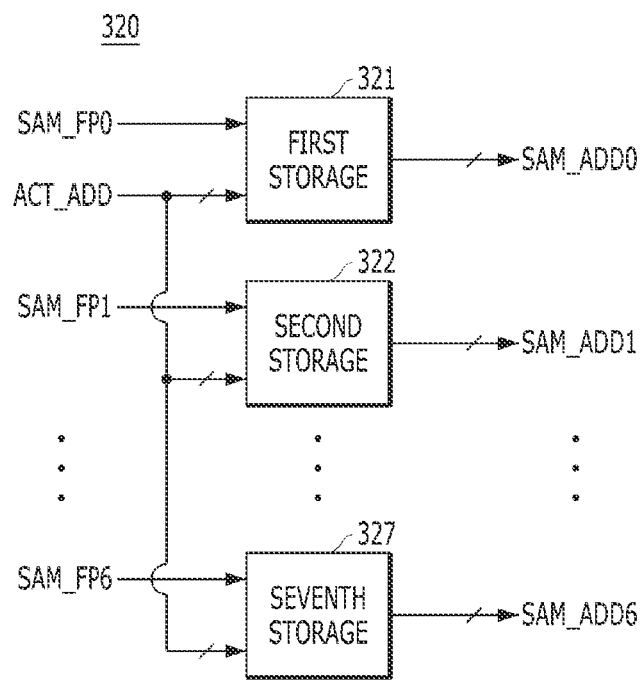
FIG. 9 is a detailed configuration diagram illustrating an address storing circuit of FIG. 7 in accordance with an embodiment of the present invention.

FIG. 9 is a detailed configuration diagram illustrating the address storing circuit 320 of FIG. 7 in accordance with an embodiment of the present invention. Referring to FIG. 9, the address storing circuit 320 may include first to seventh storages 321 to 327 which store the active address ACT_ADD as the first to seventh sampling addresses SAM_ADD0 to SAM_ADD6 in response to the first to seventh falling edge signals SAM_FP0 to SAM_FP6, respectively.

Referring back to FIG. 7, the address output circuit 330 may output one of the first to seventh sampling addresses SAM_ADD0 to SAM_ADD6 as the target address TADD based on the first to seventh valid section signals F_VALID0 to F_VALID6, when the target refresh command TREF is inputted. The address output circuit 330 may determine an uppermost valid section signal among the activated valid section signals of the first to seventh valid section signals F_VALID0 to F_VALID6, and select one of the first to seventh sampling addresses SAM_ADD0 to SAM_ADD6 according to the uppermost valid section signal.

Figure 10:
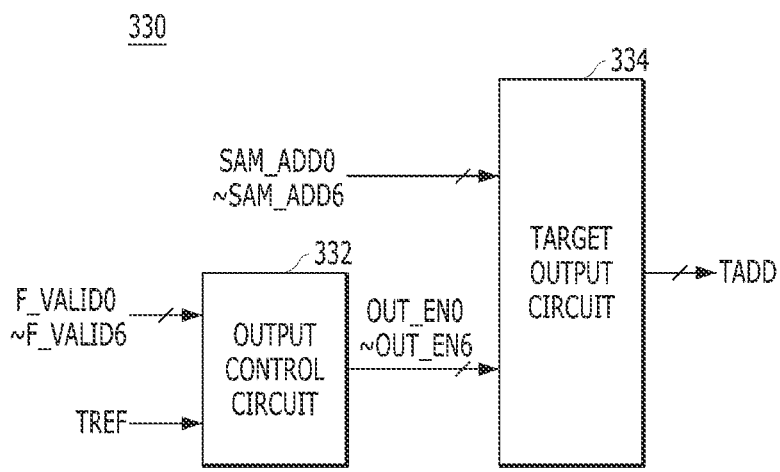
FIG. 10 is a detailed configuration diagram illustrating an address output circuit of FIG. 7 in accordance with an embodiment of the present invention.

FIG. 10 is a detailed configuration diagram illustrating the address output circuit 330 of FIG. 7 in accordance with an embodiment of the present invention.

Referring to FIG. 10, the address output circuit 330 may include an output control circuit 332 and a target output circuit 334.

The output control circuit 332 may generate first to seventh output enable signals OUT_EN0 to OUT_EN6 based on the first to seventh valid section signals F_VALID0 to F_VALID6, when the target refresh command TREF is inputted. The output control circuit 332 may activate an output enable signal corresponding to the uppermost valid section signal. For example, the output control circuit 332 may determine the activated valid section signals of the first to seventh valid section signals F_VALID0 to F_VALID6 in a descending order from an uppermost valid section signal (i.e., the seventh valid section signal F_VALID6) to a lowest interval signal (i.e., the first valid section signal F_VALID0), and activate the output enable signal corresponding to the uppermost valid section signal.

The target output circuit 334 may output one of the first to seventh sampling addresses SAM_ADD0 to SAM_ADD6 as the target address TADD according to the first to seventh output enable signals OUT_EN0 to OUT_EN6.

Figure 11:
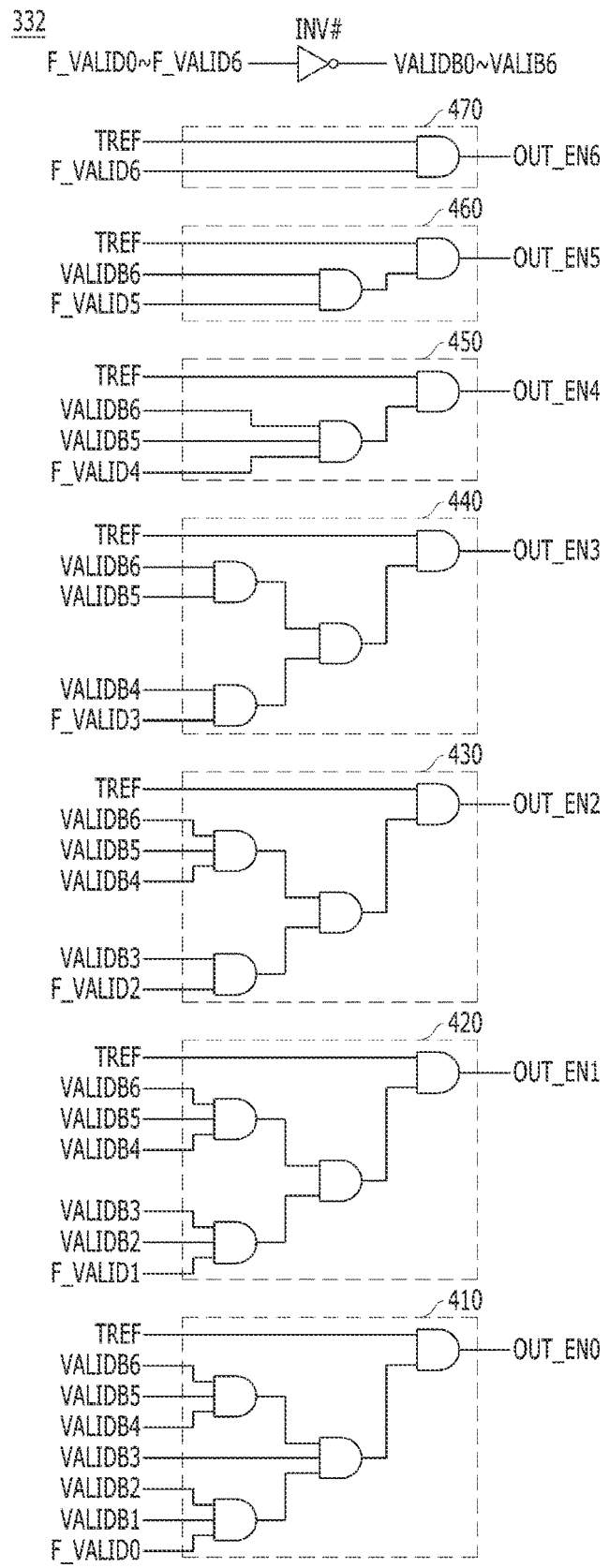
FIG. 11 is a circuit diagram illustrating an output control circuit of FIG. 10 in accordance with an embodiment of the present invention.

FIG. 11 is a circuit diagram illustrating the output control circuit 332 of FIG. 10 in accordance with an embodiment of the present invention.

Referring to the FIG. 11, the output control circuit 332 may include first to seventh output controllers 410 to 470. For reference, the output control circuit 332 may further include inverters INV # which output first to seventh inverted section signals VALIDB0 to VALIDB6 by inverting the first to seventh valid section signals F_VALID0 to F_VALID6.

The first output controller 410 may output the first output enable signal OUT_EN0 by determining whether the first valid section signal F_VALID0 is the uppermost valid section signal among the activated valid section signals, when the target refresh command TREF is input. That is, the first output control unit 410 may activate the first output enable signal OUT_EN0 in case where the first valid section signal F_VALID0 is activated while all of the upper valid section signals (i.e., the second to seventh valid section signals F_VALID1 to F_VALID6) are deactivated. For example, the first output control unit 410 may include AND gates for performing a logic AND operation on the target refresh command TREF, the second to seventh inverted section signals VALIDB1 to VALIDB6, and the first valid section signal F_VALID0.

The second output controller 420 may output the second output enable signal OUT_EN1 by determining whether the second valid section signal F_VALID1 is the uppermost valid section signal among the activated valid section signals, when the target refresh command TREF is input. That is, the second output control unit 420 may activate the second output enable signal OUT_EN1 in case where the second valid section signal F_VALID1 is activated while all of the upper valid section signals (i.e., the third to seventh valid section signals F_VALID2 to F_VALID6) are deactivated. For example, the second output control unit 420 may include AND gates for performing a logic AND operation on the target refresh command TREF, the third to seventh inverted section signals VALIDB2 to VALIDB6, and the second valid section signal F_VALID1.

In this way, the sixth output controller 460 may output the sixth output enable signal OUT_EN5 by determining whether the sixth valid section signal F_VALID5 is the uppermost valid section signal among the activated valid section signals, when the target refresh command TREF is input. That is, the sixth output control unit 460 may activate the sixth output enable signal OUT_EN5 in case where the sixth valid section signal F_VALID5 is activated while the upper valid section signal (i.e., the seventh valid section signals F_VALID6) is deactivated. For example, the sixth output control unit 460 may include AND gates for performing a logic AND operation on the target refresh command TREF, the seventh inverted section signals VALIDB6, and the sixth valid section signal F_VALID5.

The seventh output controller 470 may output the seventh output enable signal OUT_EN6 by determining whether the seventh valid section signal F_VALID6 is the uppermost valid section signal among the activated valid section signals, when the target refresh command TREF is input. For example, the seventh output control unit 470 may include an AND gate for performing a logic AND operation on the target refresh command TREF and the seventh valid section signal F_VALID6.

Figure 12:
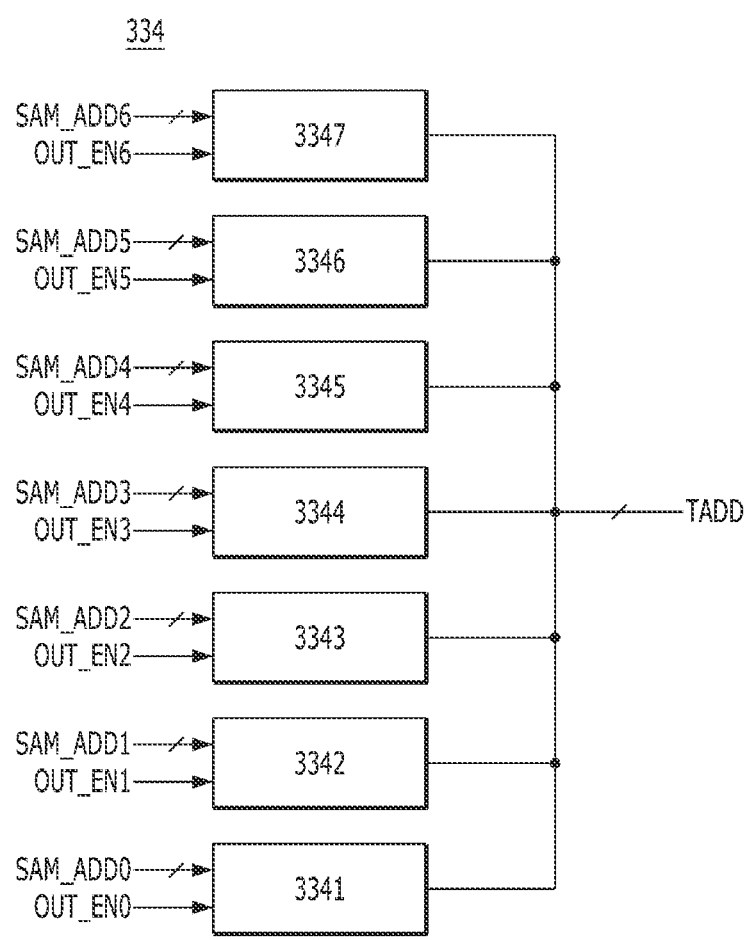
FIG. 12 is a detailed configuration diagram illustrating a target output circuit shown in FIG. 10 in accordance with an embodiment of the present invention.

FIG. 12 is a detailed configuration diagram illustrating the target output circuit 334 shown in FIG. 10 in accordance with an embodiment of the present invention.

Referring to FIG. 12, the target output circuit 334 may include first to seventh target outputters 3341 to 3347. The first to seventh target outputters 3341 to 3347 may output one of the first to seventh sampling addresses SAM_ADD0 to SAM_ADD6 as the target address TADD according to the first to seventh output enable signals OUT_EN0 to OUT_EN6, respectively.

Hereinafter, a sampling operation according to an embodiment of the present invention will be described with reference to FIGS. 1 to 14.

Figure 13:
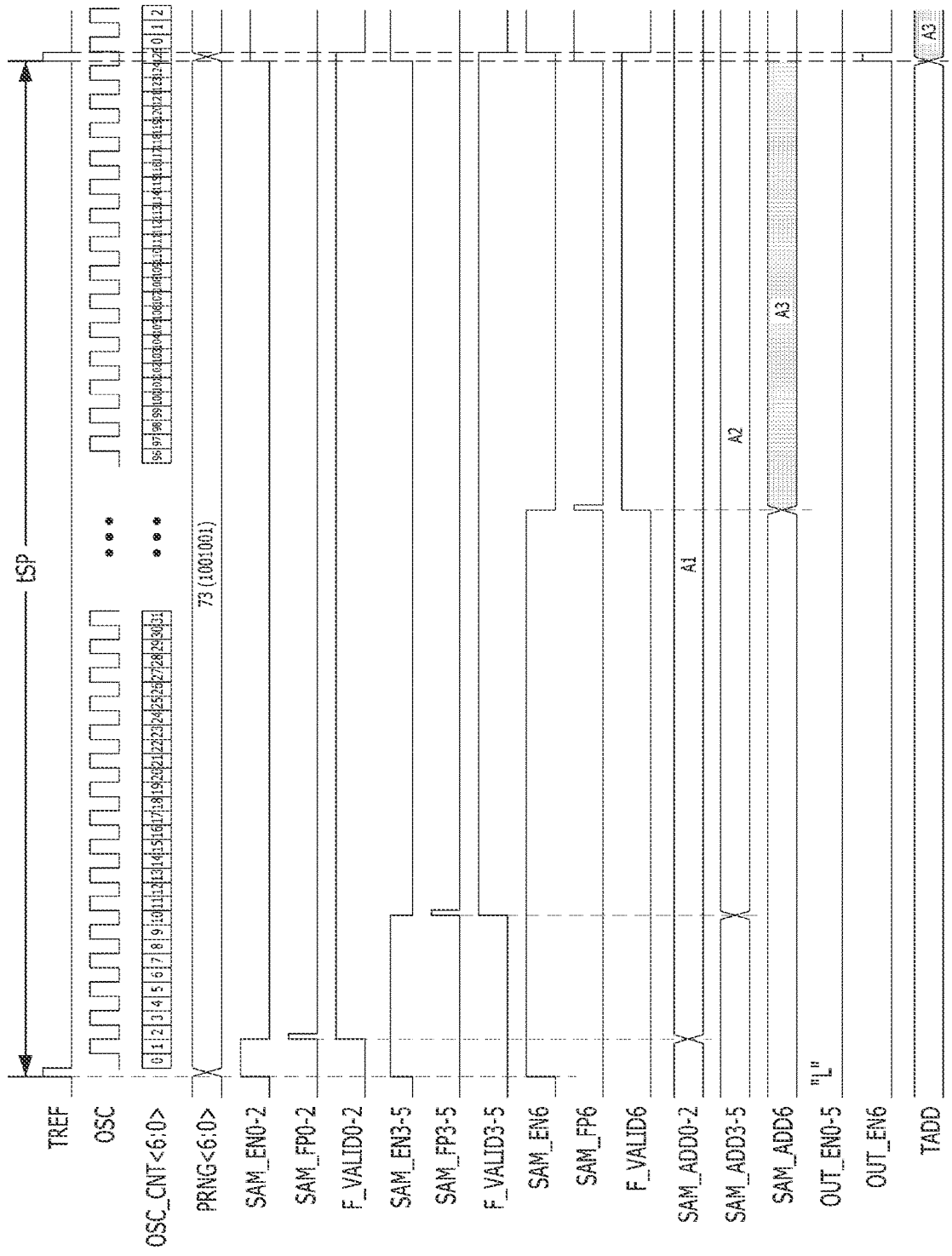
FIGS. 13 and 14 are waveform diagrams for describing a sampling operation in accordance with an embodiment of the present invention.

FIG. 13 is a waveform diagram for describing a sampling operation in accordance with an embodiment of the present invention.

Referring to FIG. 13, the random signal PRNG<6:0> of "100 1001" (decimal 73) is set according to the target refresh command TREF, and the counting signal OSC_CNT from "000 0000" to "111 1101" (decimal 125) is generated since the periodic signal OSC toggles 125 times during the sampling period tSP.

According to the target refresh command TREF, the control signal generation circuit 240 may set the first to seventh sampling enable signals SAM_EN0 to SAM_EN6 to a logic high level.

As illustrated in FIG. 6, as the periodic signal OSC toggles to increase the value of the counting signal OSC_CNT<6:0>, the variable bit comparison circuit 230 may generate the first to seventh match signals MATCH0 to MATCH6 by varying numbers of the random bits of the random signal PRNG<6:0> and the counting bits of the counting signal OSC_CNT<6:0>, which are to be compared with each other for the respective match signals MATCH0 to MATCH6.

When the counting signal OSC_CNT<6:0> becomes "000 0001", the control signal generation circuit 240 may reset the first to third sampling enable signals SAM_EN0 to SAM_EN2 to a logic low level in response to the falling edges of the first to third match signals MATCH0 to MATCH2, respectively. The section definition circuit 310 may generate the first to third falling edge signals SAM_FP0 to SAM_FP2 by detecting the falling edges of the first to third sampling enable signals SAM_EN0 to SAM_EN2, to thereby activate the first to third valid section signals F_VALID0 to F_VALID2 to a logic high level. At this time, the address storing circuit 320 may store the active address ACT_ADD as the first to third sampling addresses SAM_ADD0 to SAM_ADD2 of "A1" according to the first to third falling edge signals SAM_FP0 to SAM_FP2.

When the counting signal OSC_CNT<6:0> becomes "000 1001", the control signal generation circuit 240 may reset the fourth to sixth sampling enable signals SAM_EN3 to SAM_EN5 to a logic low level in response to the falling edges of the fourth to sixth match signals MATCH3 to MATCH5, respectively. The section definition circuit 310 may generate the fourth to sixth falling edge signals SAM_FP3 to SAM_FP5 by detecting the falling edges of the fourth to sixth sampling enable signals SAM_EN3 to SAM_EN5, to thereby activate the fourth to sixth valid section signals F_VALID3 to F_VALID5 to a logic high level. The address storing circuit 320 may store the active address ACT_ADD as the fourth to sixth sampling addresses SAM_ADD3 to SAM_ADD5 of "A2" according to the fourth to sixth falling edge signals SAM_FP3 to SAM_FP5.

When the counting signal OSC_CNT<6:0> becomes "100 1001", the control signal generation circuit 240 may reset the seventh sampling enable signal SAM_EN6 to a logic low level in response to the falling edges of the seventh match signal MATCH6. The section definition circuit 310 may generate the seventh falling edge signal SAM_FP6 by detecting the falling edge of the seventh sampling enable signal SAM_EN6, to thereby activate the seventh valid section signal F_VALID6 to a logic high level. The address storing circuit 320 may store the active address ACT_ADD as the seventh sampling address SAM_ADD7 of "A3" according to the seventh falling edge signal SAM_FP6.

When a new sampling interval tSP starts according to the next target refresh command TREF, the output control circuit 332 may activate an output enable signal corresponding to the uppermost valid section signal among the activated valid section signals of the first to seventh valid section signals F_VALID0 to F_VALID6. That is, the output control circuit 332 may activate the seventh output enable signal OUT_EN6 corresponding to the seventh valid section signal F_VALID6. The seventh target output unit 3347 of the target output circuit 334 may output the seventh sampling address SAM_ADD6 of "A3" as the target address TADD according to the seventh output enable signal OUT_EN6.

As described above, when the counting signal OSC_CNT<6:0> is greater than the random signal PRNG<6:0>, the sampling circuit 136 may output the stored sampling address as the target address TADD according to the sampling enable signal corresponding to a value of the random signal PRNG<6:0>.

Figure 14:
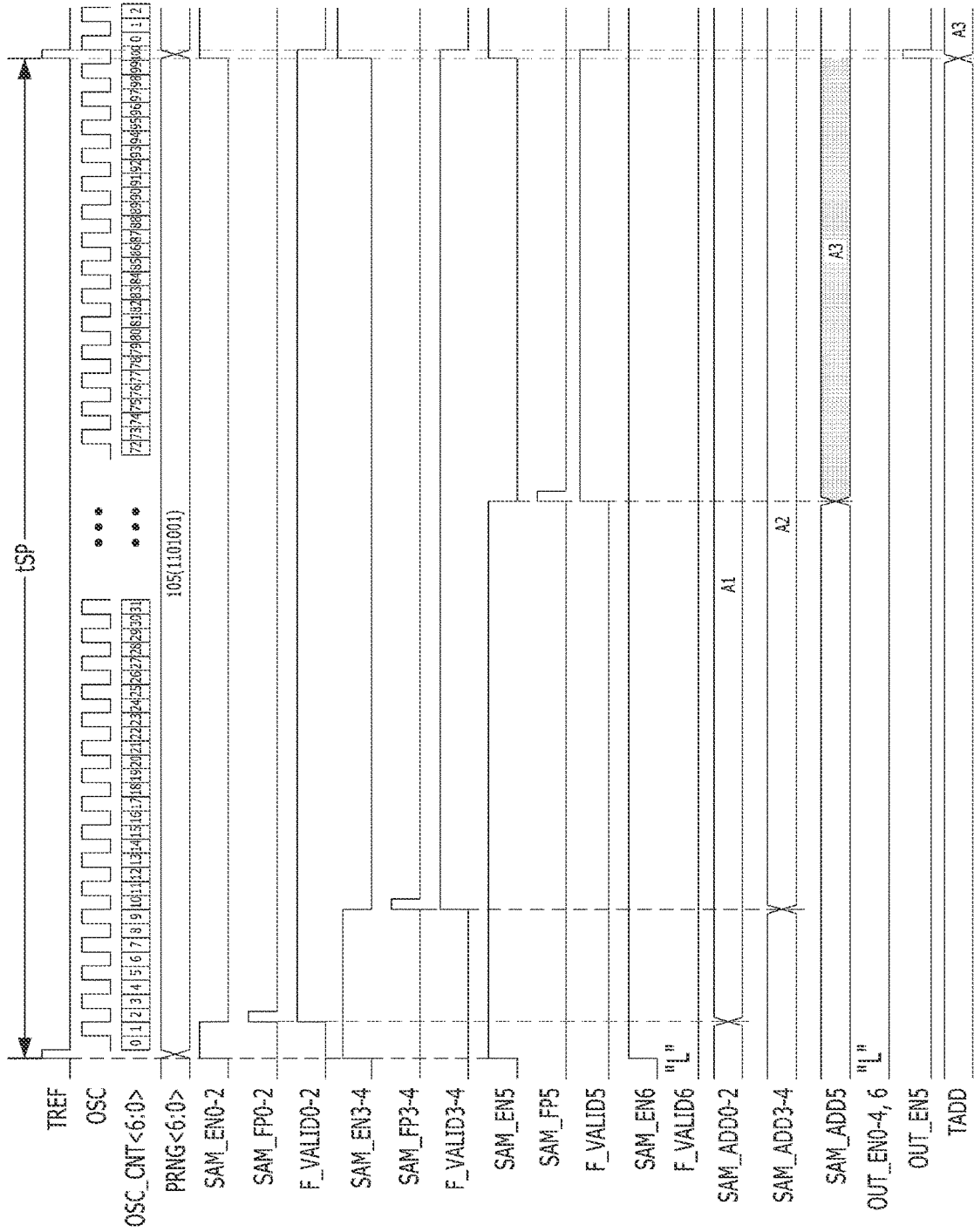

FIG. 14 is a waveform diagram for describing a sampling operation in accordance with an embodiment of the present invention.

Referring to FIG. 14, the random signal PRNG<6:0> of "110 1001" (decimal 105) is set according to the target refresh command TREF, and the counting signal OSC_CNT from "000 0000" to "110 0100" (decimal 100) is generated since the periodic signal OSC toggles 100 times during the sampling period tSP.

According to the target refresh command TREF, the control signal generation circuit 240 may set the first to seventh sampling enable signals SAM_EN0 to SAM_EN6 to a logic high level.

When the counting signal OSC_CNT<6:0> becomes "000 0001", the control signal generation circuit 240 may reset the first to third sampling enable signals SAM_EN0 to SAM_EN2 to a logic low level in response to the falling edges of the first to third match signals MATCH0 to MATCH2, respectively. The section definition circuit 310 may generate the first to third falling edge signals SAM_FP0 to SAM_FP2 by detecting the falling edges of the first to third sampling enable signals SAM_EN0 to SAM_EN2, to thereby activate the first to third valid section signals F_VALID0 to F_VALID2 to a logic high level. At this time, the address storing circuit 320 may store the active address ACT_ADD as the first to third sampling addresses SAM_ADD0 to SAM_ADD2 of "A1" according to the first to third falling edge signals SAM_FP0 to SAM_FP2.

When the counting signal OSC_CNT<6:0> becomes "000 1001", the control signal generation circuit 240 may reset the fourth and fifth sampling enable signals SAM_EN3 and SAM_EN4 to a logic low level in response to the falling edges of the fourth and fifth match signals MATCH3 and MATCH4, respectively. The section definition circuit 310 may generate the fourth and fifth falling edge signals SAM_FP3 and SAM_FP4 by detecting the falling edges of the fourth and fifth sampling enable signals SAM_EN3 and SAM_EN4, to thereby activate the fourth and fifth valid section signals F_VALID3 and F_VALID4 to a logic high level. The address storing circuit 320 may store the active address ACT_ADD as the fourth and fifth sampling addresses SAM_ADD3 and SAM_ADD4 of "A2" according to the fourth and fifth falling edge signals SAM_FP3 and SAM_FP4.

When the counting signal OSC_CNT<6:0> becomes "010 1001", the control signal generation circuit 240 may reset the sixth sampling enable signal SAM_EN5 to a logic low level in response to the falling edges of the sixth match signal MATCH5. The section definition circuit 310 may generate the sixth falling edge signal SAM_FP5 by detecting the falling edge of the sixth sampling enable signal SAM_EN5, to thereby activate the sixth valid section signal F_VALID5 to a logic high level. The address storing circuit 320 may store the active address ACT_ADD as the sixth sampling address SAM_ADD5 of "A3" according to the sixth falling edge signal SAM_FP5.

As the counting signal OSC_CNT<6:0> does not reach the random signal PRNG<6:0> and the next target refresh command TREF is inputted, a new sampling period tSP may be started. In this case, the seventh sampling enable signal SAM_EN6 maintains a logic high level, while the seventh valid section signal F_VALID5 maintains a logic low level.

The output control circuit 332 may activate the sixth output enable signal OUT_EN5 corresponding to the uppermost valid section signal among the activated valid section signals of the first to seventh valid section signals F_VALID0 to F_VALID6. The sixth target output unit 3346 of the target output circuit 334 may output the sixth sampling address SAM_ADD5 of "A3" as the target address TADD according to the sixth output enable signal OUT_EN5.

In the conventional scheme, a sampling enable signal is activated only when the counting signal OSC_CNT<6:0> exactly matches the random signal PRNG<6:0>. Thus, an index failure occurs in the sampling period when the sampling period ends before the counting signal OSC_CNT<6:0> reaches the random signal PRNG<6:0>. However, in accordance with an embodiment of the present invention, a plurality of sampling enable signals may be generated by varying numbers of the random bits of the random signal PRNG<6:0> and the counting bits of the counting signal OSC_CNT<6:0>, which are to be compared with each other for the respective sampling enable signals. That is, even if the sampling period ends before the counting signal OSC_CNT<6:0> reaches the random signal PRNG<6:0>, the sampling address may be outputted as the target address according to the sampling enable signal corresponding to one of the high bits of the random signal PRNG<6:0>. Accordingly, the index failure may be prevented and the randomization may be maximized.

Various embodiments of the present disclosure have been described in the drawings and specification. Although specific terminologies are used here, the terminologies are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein. The embodiments may be combined to form additional embodiments.

It should be noted that although the technical spirit of the disclosure has been described in connection with embodiments thereof, this is merely for description purposes and should not be interpreted as limiting. It should be appreciated by one of ordinary skill in the art that various changes may be made thereto without departing from the technical spirit of this disclosure and the following claims.

For example, for the logic gates and transistors provided as examples in the above-described embodiments, different positions and types may be implemented depending on the polarity of the input signal.

What is claimed is:

1. An integrated circuit comprising:
    a sampling control circuit configured to:
    generate a counting signal according to a periodic signal during a sampling period, and
    generate a plurality of sampling enable signals by comparing counting bits of the counting signal with random bits of a random signal; and
    a sampling circuit configured to:
    store an input address as a plurality of sampling addresses according to the respective sampling enable signals, and
    generate a plurality of valid section signals which are activated based on the respective sampling enable signals to output one of the sampling addresses as a target address according to an uppermost valid section signal among activated valid section signals.

2. The integrated circuit of claim 1, wherein the sampling control circuit is configured to generate the sampling enable signals by comparing the random bits with the counting bits, numbers to be compared between the random bits and the counting bits being different for the respective sampling enable signals during the sampling period.

3. The integrated circuit of claim 1, wherein the sampling control circuit includes:
    an oscillator configured to generate the periodic signal;
    a counter configured to generate the counting signal by counting a toggling number of the periodic signal according to a sampling signal defining the sampling period;
    a variable bit comparison circuit configured to generate a plurality of match signals by varying numbers of the random bits and the counting bits, which are to be compared with each other for the respective match signals; and
    a control signal generation circuit configured to output the sampling enable signals set to a first logic level in response to the sampling signal and to a second logic level in response to the respective match signals.

4. The integrated circuit of claim 3,
    wherein the variable bit comparison circuit includes a plurality of comparators configured to output the respective match signals, and
    wherein each of the comparators is configured to generate a corresponding match signal by comparing the numbers with each other between the random bits and the counting bits, each of the numbers corresponding to the comparator being more than a comparator at a previous stage.

5. The integrated circuit of claim 3,
    wherein the control signal generation circuit includes a plurality of latch circuits, and
    wherein each of the latch circuits is configured to:
    receive the sampling signal as a set signal,
    receive, as a reset signal, an inverted signal of a corresponding match signal, and
    output a corresponding sampling enable signal.

6. The integrated circuit of claim 1, wherein the sampling circuit includes:
    a section definition circuit configured to generate the valid section signals set to a first logic level according to the respective sampling enable signals and to a second logic level according to a sampling signal;
    an address storing circuit configured to store the input address as the sampling addresses according to the sampling enable signals; and
    an address output circuit configured to output one of the sampling addresses as the target address according to the uppermost valid section signal, when the sampling signal is inputted.

7. The integrated circuit of claim 6, wherein the section definition circuit includes:
    an edge detection circuit configured to generate a plurality of falling edge signals by detecting falling edges of the respective sampling enable signals; and
    a valid signal generation circuit configured to output the valid section signals set to a first logic level according to the respective falling edge signals and to a second logic level according to an inverted signal of the sampling signal.

8. The integrated circuit of claim 6, wherein the address output circuit includes:
an output control circuit configured to generate a plurality of output enable signals based on the respective valid section signals, when the sampling signal is inputted, an output enable signal corresponding to the uppermost valid section signal being activated among the output enable signals; and
a target output circuit configured to output one of the sampling addresses as the target address according to the output enable signals.

9. The integrated circuit of claim 8,
wherein the output control circuit includes a plurality of output controllers configured to generate the respective output enable signals, and
wherein each of the output controllers includes logic gates for performing a logic AND operation on the sampling signal, a corresponding valid section signal, and inverted signals of upper valid section signals.

10. The integrated circuit of claim 1, further comprising a random signal generation circuit configured to generate the random signal according to a sampling signal.

11. The integrated circuit of claim 10, wherein the random signal generation circuit includes a pseudo-random number generator (PRNG) based on a linear feedback shift register (LFSR).

12. A memory device comprising:
a sampling control circuit configured to:
generate a counting signal according to a target refresh command, and
generate a plurality of sampling enable signals by comparing counting bits of the counting signal with random bits of a random signal;
an address storing circuit configured to store an input address as a plurality of sampling addresses according to the respective sampling enable signals;
an address output circuit configured to output one of the sampling addresses as a target address according to an uppermost valid section signal among activated ones of a plurality of valid section signals which are activated based on the respective sampling enable signals, when the target refresh command is inputted; and
a row control circuit configured to refresh at least one word line corresponding to the target address in response to the target refresh command.

13. The memory device of claim 12, wherein the sampling control circuit includes:
an oscillator configured to generate a periodic signal;
a counter configured to generate the counting signal by counting a toggling number of the periodic signal according to the target refresh command;
a variable bit comparison circuit configured to generate a plurality of match signals by varying numbers of the random bits and the counting bits, which are to be compared with each other for the respective match signals; and
a control signal generation circuit configured to output the sampling enable signals set to a first logic level in response to the target refresh command and to a second logic level in response to the respective match signals.

14. The memory device of claim 13,
wherein the variable bit comparison circuit includes a plurality of comparators configured to output the respective match signals, and
wherein each comparator is configured to generate a corresponding match signal by comparing the numbers with each other between the random bits and the counting bits, each of the numbers corresponding to the comparator being more than a comparator at a previous stage.

15. The memory device of claim 12, further comprising a section definition circuit configured to generate the valid section signals set to a first logic level according to the respective sampling enable signals and to a second logic level according to the target refresh command.

16. The memory device of claim 15, wherein the section definition circuit includes:
an edge detection circuit configured to generate a plurality of falling edge signals by detecting falling edges of the respective sampling enable signals; and
a valid signal generation circuit configured to output the valid section signals set to a first logic level according to the respective falling edge signals and to a second logic level according to an inverted signal of the target refresh command.

17. The memory device of claim 12, wherein the address output circuit includes:
an output control circuit configured to generate a plurality of output enable signals based on the respective valid section signals, when the target refresh command is inputted, an output enable signal corresponding to the uppermost valid section signal being activated among the output enable signals; and
a target output circuit configured to output one of the sampling addresses as the target address according to the output enable signals.

18. The memory device of claim 17,
wherein the output control circuit includes a plurality of output controllers configured to generate the respective output enable signals, and
wherein each output controller includes logic gates for performing a logic AND operation on the target refresh command, a corresponding valid section signal, and inverted signals of upper valid section signals.

19. The memory device of claim 12, further comprising a random signal generation circuit configured to generate the random signal according to the target refresh command.

20. A sampling method of an integrated circuit, comprising:
setting a random signal and generating a plurality of sampling enable signals, when a sampling period starts;
generating a counting signal by counting a toggling number of a periodic signal;
sequentially deactivating the sampling enable signals by comparing counting bits of the counting signal with random bits of the random signal;
storing an input address as a plurality of sampling addresses and sequentially activating a plurality of valid section signals, according to the deactivating of the sampling enable signals; and
outputting one of the sampling addresses as a target address according to an uppermost valid section signal among the activated valid section signals, when the sampling period ends.

21. The sampling method of claim 20, wherein the sampling enable signals are sequentially deactivated by comparing the random bits with the counting bits, numbers to be compared between the random bits and the counting bits being different for the respective sampling enable signals.

22. The sampling method of claim 20, wherein the sequentially deactivating the sampling enable signals includes:

deactivating a first sampling enable signal when a first bit among the random bits is the same as a first bit among the counting bits; and deactivating a second sampling enable signal when first and second bits among the random bits are respectively the same as first and second bits among the counting bits.

23. The sampling method of claim 20, further comprising deactivating the valid section signals when the sampling period ends.

24. A memory device comprising:
a refresh circuit configured to refresh a memory cell group corresponding to a target address;
a control circuit configured to generate N number of control signals each becoming disabled when a corresponding one of N number of pairs has an identical value, each of the pairs being of one or more bits from a N-bit count code and one or more bits from a N-bit random code and the pairs respectively having bitwise different ranges between one (1) bit and N bits; and
a sampling circuit configured to:
generate, based on an active address, N number of sample addresses when the control signals become disabled, respectively,
generate N number of section signals enabled when the control signals become disabled, respectively, and
select, as the target address, one of the sample addresses, the selected sample address corresponding to a last enabled one of the section signals.

* * * * *